(12) United States Patent
Cui et al.

(10) Patent No.: US 9,171,963 B2
(45) Date of Patent: Oct. 27, 2015

(54) ELECTROSTATIC DISCHARGE SHUNTING CIRCUIT

(75) Inventors: Qiang Cui, Orlando, FL (US); Juin Jei Liou, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 341 days.

(21) Appl. No.: 13/434,377

(22) Filed: Mar. 29, 2012

(65) Prior Publication Data

US 2012/0256233 A1    Oct. 11, 2012

Related U.S. Application Data

(60) Provisional application No. 61/473,978, filed on Apr. 11, 2011.

(51) Int. Cl.
| | | |
|---|---|---|
| *H01L 29/66* | (2006.01) | |
| *H01L 29/812* | (2006.01) | |
| *H01L 27/02* | (2006.01) | |
| *H01L 29/778* | (2006.01) | |

(52) U.S. Cl.
CPC .......... *H01L 29/812* (2013.01); *H01L 27/0248* (2013.01); *H01L 29/7787* (2013.01); *H01L 29/8128* (2013.01); *H01L 2924/0002* (2013.01)

(58) Field of Classification Search
CPC .............. H01L 29/812; H01L 29/7787; H01L 27/0248; H01L 2924/0002; H01L 2924/00; H01L 29/8124; H01L 29/8128

USPC ............... 257/173, 174, 190–195, 355–360, 257/E21.407, E27.012, E29.296, E29.315; 438/167, 172, 604; 361/65
See application file for complete search history.

(56) References Cited

U.S. PATENT DOCUMENTS

| | | | |
|---|---|---|---|
| 5,473,175 A | | 12/1995 | Nikaido et al. |
| 5,504,353 A | * | 4/1996 | Kuzuhara ...................... 257/194 |
| 5,773,334 A | * | 6/1998 | Ohnishi et al. ................ 438/782 |
| 6,177,685 B1 | | 1/2001 | Teraguchi et al. |
| 6,822,295 B2 | * | 11/2004 | Larson .......................... 257/355 |
| 7,679,870 B2 | | 3/2010 | Lin et al. |
| 2008/0080108 A1 | * | 4/2008 | Lin et al. ......................... 361/56 |
| 2008/0179630 A1 | * | 7/2008 | Atherton ....................... 257/192 |
| 2009/0032820 A1 | * | 2/2009 | Chen ............................... 257/76 |
| 2009/0104881 A1 | * | 4/2009 | Ogawa et al. ................... 455/83 |

\* cited by examiner

*Primary Examiner* — Fernando L Toledo
*Assistant Examiner* — Aaron Gray
(74) *Attorney, Agent, or Firm* — Jetter & Associates, P.A.

(57) ABSTRACT

An integrated electrostatic discharge (ESD) shunting circuit includes a III-V semiconductor layer, and a first drain-less high electron mobility transistor (HEMT) or a metal-semiconductor FET (MESFET) transistor having a first gate and at least a second drain-less HEMT or MESFET having a second gate formed in the substrate. The HEMTs or MESFETs include a donor layer on the semiconductor layer, no drains, and a source including an ohmic contact layer on the donor layer.

7 Claims, 5 Drawing Sheets

ELECTROSTATIC DISCHARGE SHUNTING CIRCUIT

CROSS REFERENCE TO RELATED APPLICATIONS

This application claims the benefit of Provisional Application Ser. No. 61/473,978 entitled "ELECTROSTATIC DISCHARGE PROTECTION DEVICE", filed Apr. 11, 2011, which is herein incorporated by reference in its entirety.

FIELD

This Disclosure relates to high electron mobility transistor (HEMT) or metal-semiconductor FET (MESFET)-based electrostatic discharge (ESD) protection circuitry.

BACKGROUND

An ESD protection cell is used to protect pins/pads/terminals of an integrated circuit (IC) from ESD events happening to internal circuitry between the terminal points and ground. An ESD protection cell positioned parallel to the internal circuit shunts potentially damaging ESD-induced current transients to prevent ESD damage to the internal circuitry. A conventional ESD protection circuit includes an ESD shunting circuit and an optional ESD trigger circuit.

ICs can include a plurality of Schottky gate field effect transistors such as HEMTs or MESFETs. Such ICs include high power RF amplifiers using GaN HEMTs for various applications, such as for wireless infrastructure applications in the Wideband Code Division Multiple Access (WCDMA) and Worldwide Interoperability for Microwave Access (WiMAX) bands.

HEMTs or MESFETs may also be used in ESD protection devices on ICs including a plurality of HEMT or MESFET devices. Traditional HEMT-based ESD protection devices provide their protection by current conduction current through a thin two-dimensional electron gas (2DEG) layer (or 2DEG channel). Similarly, in a MESFET, current conduction is within a thin lightly doped (typically n-type) conducting layer of semiconducting material epitaxially grown over the buffer layer.

SUMMARY

Disclosed embodiments recognize the current conduction through the thin two-dimensional electron gas (2DEG) channel in traditional HEMT-based ESD protection devices or the thin conducting channel for MESFET-based protection devices can limit the amount of current that can be discharged before material failure. In such HEMT-based devices, for example, it has been recognized that the drain causes the ESD-induced current to be conducted by the 2DEG channel, which because the 2DEG channel is narrow can result in poor robustness, including susceptibility to damage to the HEMTs in the ESD protection circuitry under the ESD condition.

By providing disclosed "drain-less" HEMTs and MESFETs, the current flow in disclosed HEMTs without a conventional drain is instead conducted in the wider layer above the 2DEG channel (or thin conducting channel, such as in an N+ AlGaAs donor layer, and hence disclosed ESD shunting circuits and related ESD protection devices are substantially more ESD robust as compared to their conventional HEMT or MESFET counterparts. As used herein, "drain-less" HEMTs and MESFETs can be formed from conventional HEMTs or MESFETs having conventional drains by lacking (skipping) the conventional drain entirely by adjusting the circuit design (i.e. via masks). Lacking a conventional drain also reduces the size (area) of HEMT or MESFET devices and thus provides a decrease in die area that decreases the die cost. A "Drain-like" function for purposes of this Disclosure is any device, layer, combination of layers, materials or the like that are effective to establish current flow (conduct current) through a 2DEG channel (for a conventional HEMT or MESFET) or the region above the 2DEG channel, such as the doped layer 104 (e.g., N+ GaAs layer) above the 2DEG channel described below in FIG. 1A for disclosed embodiments, where the terminal that provides the Drain-like function for disclosed transistors is referred herein by the term "second terminal".

DETAILED DESCRIPTION

Figure 1A:
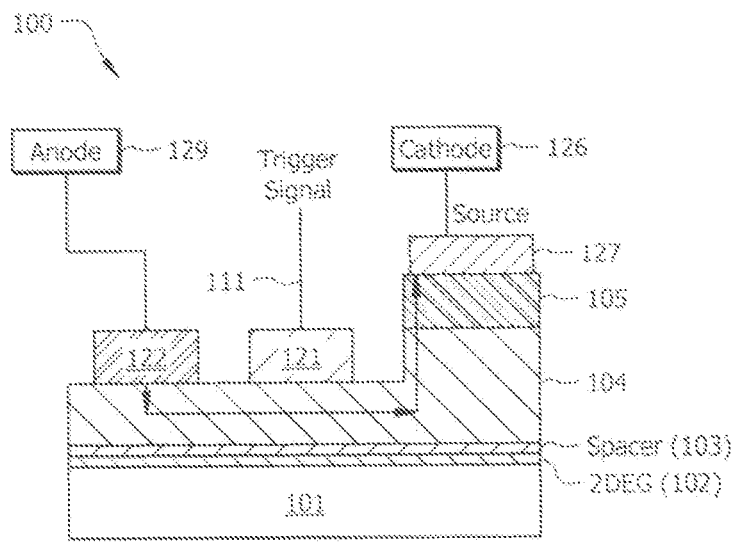
FIG. 1A is a cross-sectional depiction of an example integrated ESD shunting circuit, according to an example embodiment.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid unnecessary and burdensome details. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

FIG. 1A is a cross-sectional depiction of an example integrated ESD shunting circuit 100, according to an example embodiment, formed with at least a first and a second disclosed drain-less HEMT transistor shown having a gates 121 and a second terminal 122 which provides a Drain-like function by sinking or injecting current to an outside anode terminal, respectively. The transistors in disclosed ESD protection circuits may include any combination of enhancement mode (E-mode) and depletion mode (D-mode) gates or second terminal contacts. Although the transistor in ESD shunting circuit 100 is shown as a drain-less HEMT, the transistor may also comprise drain-less metal-semiconductor FETs (MESFETs).

Structures grown with the same lattice constant but different band gaps are simply referred to in the art as lattice-matched HEMTs, or simply HEMTs. Those structures grown with slightly different lattice constants are called pseudomorphic HEMTs or PHEMTs. Disclosed embodiments include both HEMTs and PHEMTs.

As known in the art, an important point about the channel layer in conventional HEMT and related PHEMT devices is the 2DEG channel that results from the band-gap difference typically between an $Al_xGa_{1-x}As$ and GaAs layer (or $Al_xGa_{1-x}As$ and $In_xGa_{1-x}As$ layer in the case of the PHEMT). This feature is in contrast to the MESFET, which has a doped channel and consequently a high concentration of ionized donors. However, as noted above, disclosed HEMTs and PHEMTs are drain-less and instead use at least one second terminal which provides a Drain-like function, and as a result does not utilize the 2DEG channel.

ESD shunting circuit 100 (and ESD protection circuit 150 including an ESD trigger circuit and an ESD shunting circuit described below relative to FIG. 1B) may be a stand-alone circuit in one embodiment. Alternatively, disclosed ESD shunting circuits 100 and related ESD protection circuits can be provided on an IC that includes functional circuitry for carrying out a function, such as power application, with disclosed ESD shunting circuits 100 or ESD protection circuits provided for each pin of the IC needing ESD protection, such as described below relative to FIG. 2.

ESD shunting circuit 100 includes a III-V semiconductor layer 101. semiconductor layer 101 can be a III-V semiconductors substrate, or be provided as an epitaxial layer on another substrate material. For example, disclosed HEMTs and MESFETs can comprise a semi-insulating GaAs layer using molecular beam epitaxy (MBE), or less commonly, metal-organic chemical vapor deposition (MOCVD) on a suitable substrate. Semiconductor layer 101 can also comprise one of the Group III-nitrides such as gallium nitride (GaN). Some substrates examples include GaP, SiC, InP, and sapphire ($Al_2O_3$).

A high carrier concentration 2DEG channel 102 such as an InGaAs layer for PHEMT is on the semiconductor layer 101. In this embodiment the InGaAs layer generally comprises $In_xGa_{1-x}As$, where $In_xAs$ is typically constrained to x<0.3 for GaAs-based devices. A spacer layer 103, such as an AlGaAs layer, is on the 2DEG channel 102. The thickness and doping of spacer layer 103 is selected for the absence of free electrons under normal operation. A doped donor layer 104 comprising a doped wide bandgap material such as N+ AlGaAs is on the spacer layer 103. Doped layer 104 as shown includes both a raised portion and a recessed portion. The region shown as the source (S) having source contact 127 thereon provides a common source. The S includes an ohmic contact layer 105 such as an N+ GaAs layer on the raised portion of the donor layer 104. Second terminal 122 is shown directly contacting the recessed portion of the doped layer 104, which provides a Drain-like function, and is shown connected to the anode 129 in FIG. 1B for the ESD protection circuit 100. Gate 121 is on the recessed portion of the donor layer 104. Gate 121 and second terminal 122 can comprise a metal or metal alloy, such as comprising Ti, W, Au, or any combination thereof. In some embodiments, the alloy comprises TiW/Au. The source contact 127 can comprise a metal or metal alloy, such as gold, silver or aluminum.

It can also be seen by the arrows provided that the current flow triggered by an ESD event by the drain-less HEMT having second terminal 122 is conducted in a relatively wide doped donor layer 104 such as an N+ AlGaAs layer as compared to the very narrow 2DEG channel in a conventional HEMT. Accordingly, ESD shunting circuit 100 is substantially more robust as compared to the conventional ESD shunting circuits based on conventional HEMTs having drains which result in the ESD induced current passing through the 2DEG channel. For such conventional ESD protection circuits, since the 2DEG channel is very narrow, the HEMT is more likely to be damaged under ESD conditions. Similarly disclosed drain-less MESFETS help widen the conduction channel as compared to conventional MESFETs which as noted above utilize a thin conduction layer, reducing the likelihood of damage under ESD conditions.

Figure 1B:
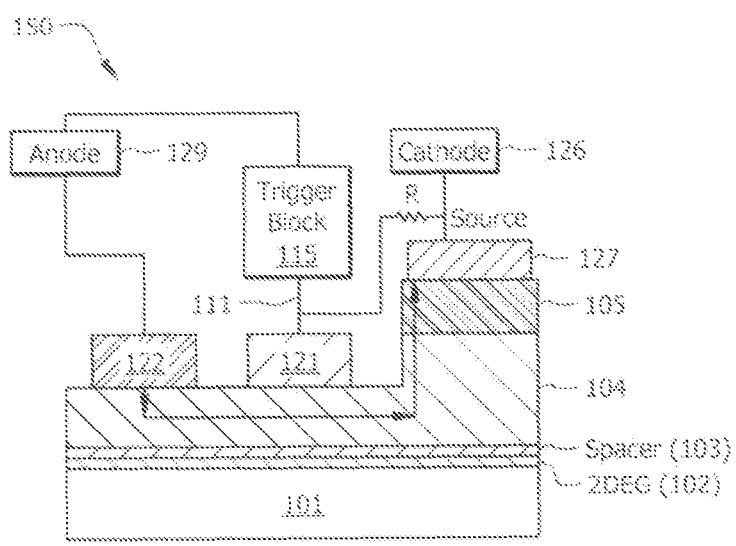
FIG. 1B is a cross-sectional depiction of an example integrated ESD protection circuit, including an ESD trigger circuit and an ESD shunting circuit, according to an example embodiment.

FIG. 1B is a cross-sectional depiction of an example integrated ESD protection circuit 150, including an ESD trigger block 115 for providing the trigger signal 111 along with the ESD shunting circuit 100 of FIG. 1A, according to an example embodiment. The ESD trigger block 115 in one embodiment can comprise a diode string formed on the semiconductor layer 101.

For example, trigger block 115 can comprise a plurality of diodes in series connected between a terminal on the IC to be protected (that serves as the anode 129 shown) and a second node shown as the cathode 126 through a resistor R, where the cathode is generally a ground terminal, and where the connection of the resistor R to ground (or another terminal) sets the trigger current. The output of trigger block 115 is also coupled to gate 121, so that the gate 121 receives the triggering signal from the trigger block 115 during an ESD event. Although in most cases the trigger signal 111 output of the trigger block 115 is connected to a ground terminal, such as through the resistor R shown, there is no such requirement, and in some embodiments the trigger signal 111 output of the trigger block 115 can be connected to a different terminal besides coupling to the gate 121.

For an HEMT process, the on-chip diodes can be GaAs Schottky diodes, or a variety of different diode types if the diodes are externally connected. The value of the resistor R can be selected based on the desired trigger current. For a larger R value, the device can be triggered under lower current. For a smaller R value, the device will be triggered under higher current. The trigger current is generally adjusted by selection of R to set a trigger current according to the functional circuitry being protected.

In FIG. 1B, it can be seen by the arrows provided that the path from second terminal 122 to the source contact 127 is in parallel to the path between the trigger block 115 and the source contact 127.

Figure 2:
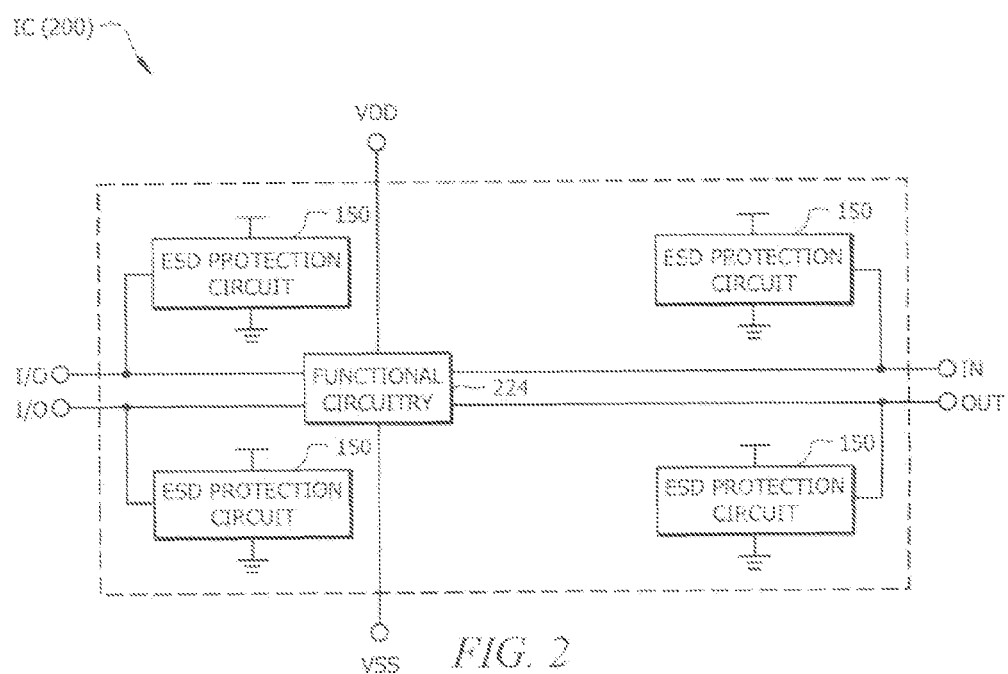
FIG. 2 illustrates a high level depiction of an IC into which disclosed ESD protection circuits may be incorporated to protect one or more terminals of the IC, according to an example embodiment.

FIG. 2 illustrates a high level depiction of a construction of an IC 200 into which disclosed ESD protection circuits 150 may be incorporated to protect one or more terminals of the IC, according to an example embodiment. IC 200 includes functional circuitry 224, which is circuitry that realizes and carries out desired functionality of IC 200, such as that of a RF power amplifier. The capability of functional circuitry provided by IC 200 may vary, for example ranging from a simple digital inverter to a complex device such as an on-chip integrated radio-frequency (RF) receiver/transmitter (Rx/Tx) system. The specific functionality contained within functional circuitry 224 is not of importance to disclosed embodiments.

IC 200 also includes a number of external terminals, by way of which functional circuitry 224 carries out its function. A few of those external terminals are illustrated in FIG. 2. It is to be understood that the number of terminals and their function can also vary widely. In the example of IC 200 shown in FIG. 2, two terminals I/O operate as common input and output terminals, by way of which functional circuitry 224 can receive incoming signals and can generate outputs, as well known in the art. A dedicated input terminal IN is also shown in FIG. 2 for IC 200, as is a dedicated output terminal OUT. Each of terminals IN, OUT are also connected to functional circuitry 224. Power supply terminal Vdd receives a positive power supply voltage in this example, while ground terminal Vss is provided to receive a reference voltage, such as system ground.

IC 200 includes an instance of a disclosed ESD protection circuit 150 connected to each of its terminals except its power supply terminals which are assumed to be self protected by large area diodes, and thus not need a disclosed ESD protection circuit. Each ESD protection circuit 150 shown is connected to its corresponding terminal in parallel with functional circuitry 224.

Adding more than two total gates and/or second terminals allows the current discharge path during ESD events to be further widened. FIGS. 3-6 described below feature ESD protection circuits having ESD shunting circuits having four (4) total gates and second terminals each. However, it is understood disclosed ESD shunting circuits may include 2, 3, 4, 5, 6, or any total number of gates and second terminals ≥2.

Figure 3:
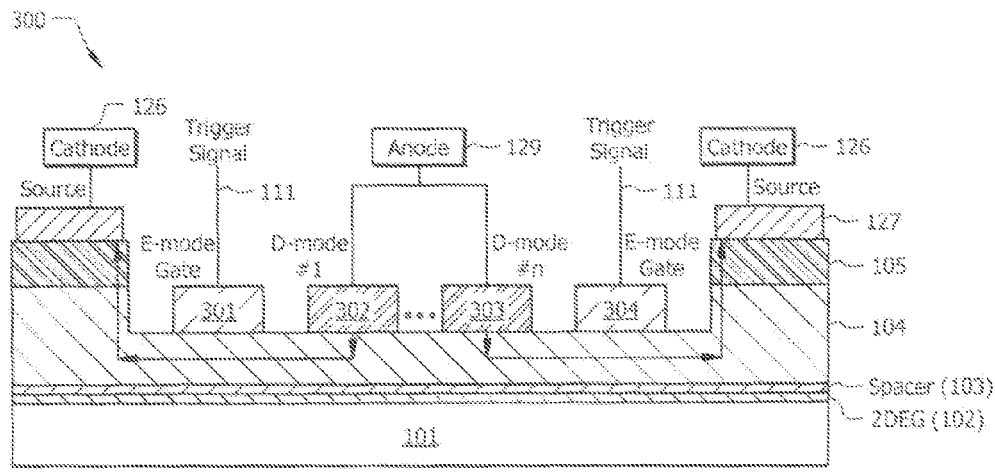
FIG. 3 is a cross-sectional depiction of an example ESD shunting circuit, according to another example embodiment, having disclosed drain-less HEMTs. This implementation has both depletion-mode (D-mode) second terminal contacts and enhancement-mode (E-mode) gates.

FIG. 3 is a cross-sectional depiction of an example ESD shunting circuit 300, according to another example embodiment, having disclosed drain-less HEMTs. This implementation has both depletion-mode (D-model second contacts and enhancement-mode (E-model gates. Gates are shown as 301 and 304 (both E-mode), second terminals as 302 and 303 (both D-mode). As known in the art, enhancement mode refers to the underlying semiconductor surface being off without applied bias and requiring an applied bias to turn on, while depletion mode refers to the underlying semiconductor surface being normally on without applied bias and requiring an applied bias to turn off, where the mode can be set by gate/contact material and/or surface doping under the contact. As described above, an advantage of removing conventional drains from HEMTs is to increase the current discharge efficiency. Without a conventional drain region included, the ESD induced current is discharged in the wide discharge channel in donor layer 104, which can be further widened by extra gates or second terminals, so that the current discharge efficiency is substantially increased over conventional HEMTs that have a single gate which because of the presence of a conventional drain only discharges the ESD induced current in the thin 2DEG channel.

Figure 4:
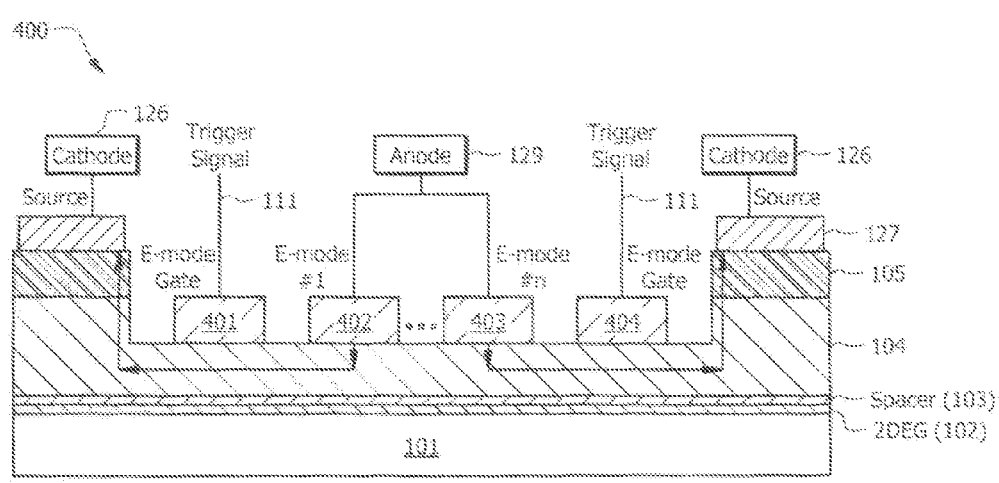
FIG. 4 is a cross-sectional depiction of an example ESD shunting circuit, according to another example embodiment, having disclosed drain-less HEMTs. This implementation has all E-mode gates and second terminal contacts.

FIG. 4 is a cross-sectional depiction of an example ESD shunting circuit 400, according to another example embodiment, having disclosed drain-less HEMTs. This implementation has all E-mode gates and second terminals. Gates are shown as 401 and 404, while the second terminals are shown as 402 and 403.

Figure 5:
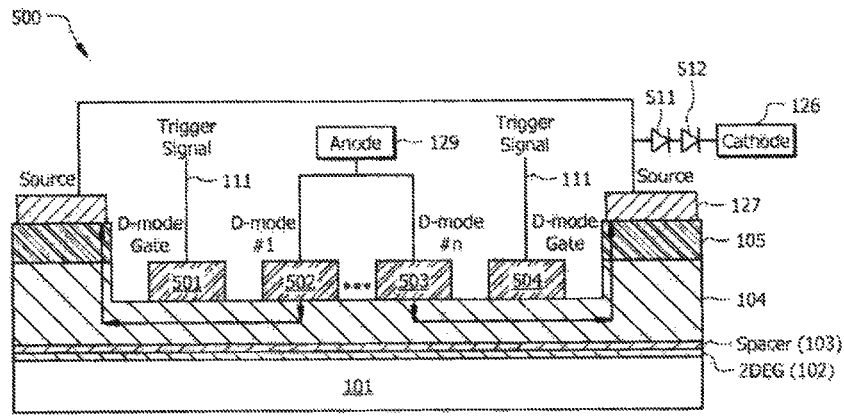
FIG. 5 is a cross-sectional depiction of an example ESD shunting circuit, according to another example embodiment, having disclosed drain-less HEMTs. This implementation has all D-mode gates and second terminal contacts.

FIG. 5 is a cross-sectional depiction of an example ESD shunting circuit 500, according to another example embodiment, having disclosed drain-less HEMTs. This implementation has all D-mode gates and second terminals. Gates are shown as 501, 504, while the second terminals are shown as 502 and 503. Two optional diodes 511, 512 are shown placed in series with the conducting channel of the HEMTs to reduce leakage current.

Figure 6:
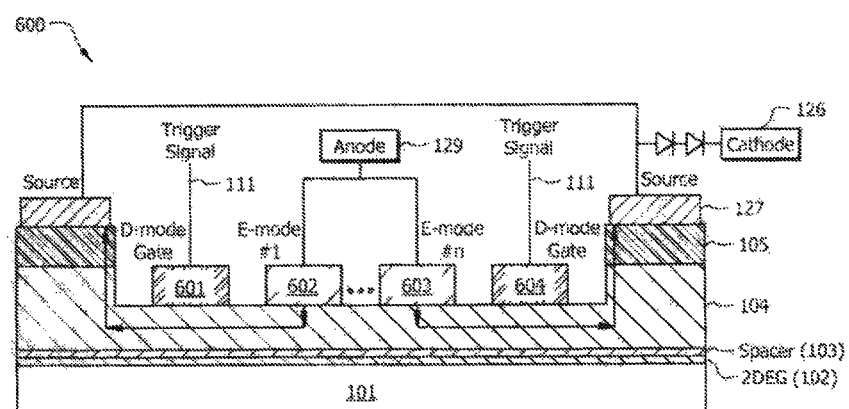
FIG. 6 is a cross-sectional depiction of an example ESD shunting circuit, according to another example embodiment, having disclosed drain-less HEMTs. This implementation has both D-mode gates and E-mode second terminal contacts.

FIG. 6 is a cross-sectional depiction of an example ESD shunting circuit 600, according to another example embodiment, having disclosed drain-less HEMTs. This implementation has both D-mode and E-mode gates and E-mode second terminals. D-mode gates are shown as 601 and 604, while E-mode second terminals are shown as 602 and 603. Diodes 511, 512 are again shown in series with the conducting channel of the HEMTs to reduce leakage current.

EXAMPLES

Disclosed embodiments are further illustrated by the following specific Examples, which should not be construed as limiting the scope or content of this Disclosure in any way.

Figures 7A, 7B:
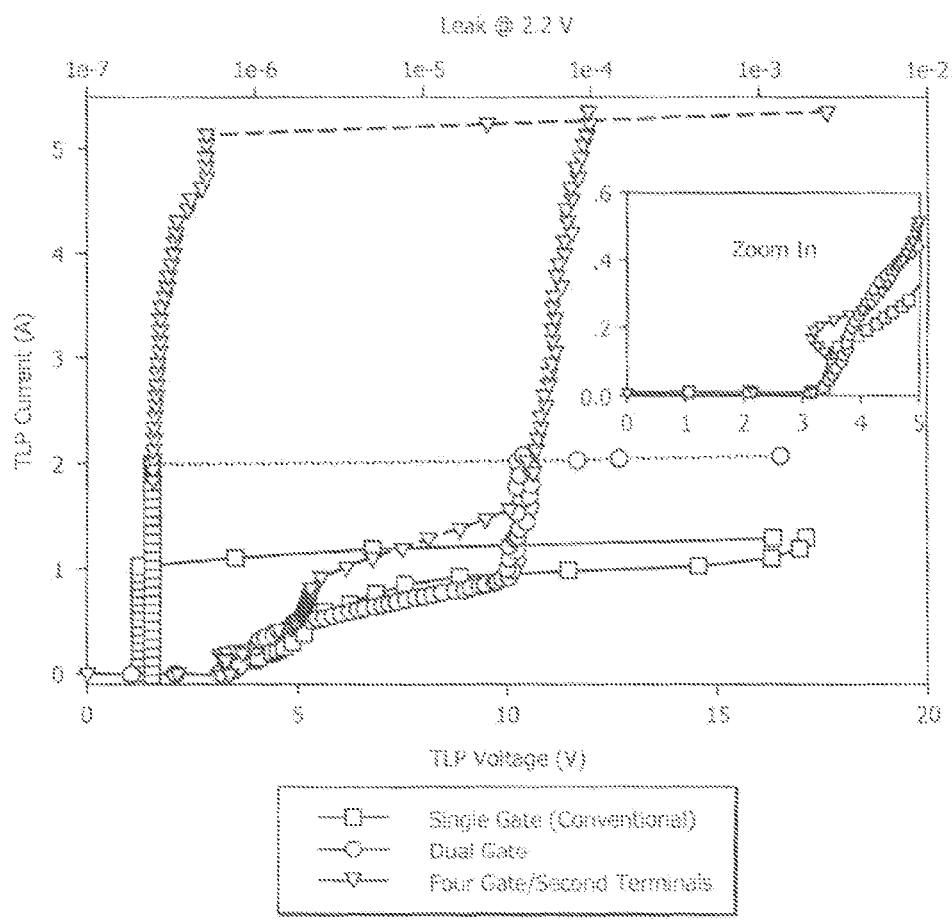
FIGS. 7A and 7B provide comparative ESD transmission line pulse (TLP; or It2) vs. voltage test data for a conventional single gate HEMT, a HEMT having dual (2) gates with a single drain, and a disclosed drain-less HEMT having a total of four (4) gates and second terminals (and no conventional drains) based on the ESD shunting circuit shown in FIG. 3.

It has been experimentally shown that disclosed drain-less HEMTs can handle at least 100% greater ESD induced current than conventional HEMTs. For example, FIGS. 7A and 7B provide comparative ESD transmission line pulse (TLP; or It2) vs. voltage test data for a conventional single gate HEMT, an HEMT having dual (2) gates with a single drain, and a disclosed drain-less HEMT having a total of four (4) gates and second terminals (and no conventional drains) based on ESD shunting circuit 300 shown in FIG. 3 (2 D-mode second contacts and 2 E-mode gates). It2 corresponds to the maximal current handling capability of a ESD protection device. FIG. 7B is a table that shows the It2 data from FIG. 7A, as well as some area data for the respective devices. The disclosed four-gate/second terminal shunting circuit is seen to provide almost a 5.2 Amperes handling ability (Y axis), while the conventional single HEMT gate and the dual-gate device described-above are seen to provide a much lower current handling ability.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

We claim:

1. An electrostatic discharge (ESD) protection circuit with trigger, comprising:

an ESD trigger circuit for coupling between a first terminal to be protected and another terminal; and an ESD shunting circuit including a high electron mobility transistors (HEMT) or a metal-semiconductor FET (MESFET) transistor including a substrate comprising a III-V semiconductor layer having a single doped layer on said semiconductor layer that includes a raised portion and a recessed portion; at least one gate contacting said recessed portion of said single doped layer and at least one second terminal directly contacting said recessed portion of said single doped layer for providing a Drain-like function, and a source on said raised portion of said single doped layer, wherein said second terminal is only directly connected to said terminal to be protected;

wherein said gate is coupled to receive a triggering signal from said ESD trigger circuit and said second terminal is configured for coupling to said terminal to be protected, and wherein said ESD shunting circuit provides a conducting channel between said second terminal and said source during an ESD event at said terminal to be protected.

2. The ESD protection circuit of claim 1, wherein said ESD trigger circuit comprises a triggering diode string comprising a plurality of diodes in series.

3. The ESD protection circuit of claim 1, wherein said substrate comprises GaAs, and wherein said second terminal comprises a metal.

4. The ESD protection circuit of claim 3, further comprising a two-dimensional electron gas (2DEG) channel comprising InGaAs between said GaAs and said single doped layer, wherein said HEMT or MESFET comprise a pHEMT.

5. The ESD protection circuit of claim 1, wherein said gate is an enhancement mode gate and said second terminal provides a depletion mode contact.

6. The ESD protection circuit of claim 5, wherein said at least one gate comprises a plurality of said gates and said at least one second terminal includes a plurality of said second terminals.

7. The ESD protection circuit of claim 1, wherein said substrate comprises GaAs, further comprising a two-dimensional electron gas (2DEG) channel comprising InGaAs on said GaAs, a spacer layer comprising AlGaAs on said 2DEG channel, wherein said single doped layer comprises N+ AlGaAs on said spacer layer, wherein said HEMT or MESFET comprises a pHEMT, and wherein said source includes an ohmic contact layer comprising N+ GaAs on said single doped layer.

* * * * *